United States Patent
Hashimoto

(10) Patent No.: US 8,599,304 B2
(45) Date of Patent: Dec. 3, 2013

(54) IMAGE CAPTURING APPARATUS HAVING FOCUS DETECTION PIXELS PRODUCING A FOCUS SIGNAL WITH REDUCED NOISE

(75) Inventor: Yoshitaka Hashimoto, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 10 days.

(21) Appl. No.: 13/511,245

(22) PCT Filed: Dec. 1, 2010

(86) PCT No.: PCT/JP2010/071947
§ 371 (c)(1),
(2), (4) Date: May 22, 2012

(87) PCT Pub. No.: WO2011/086792
PCT Pub. Date: Jul. 21, 2011

(65) Prior Publication Data
US 2012/0229696 A1   Sep. 13, 2012

(30) Foreign Application Priority Data
Jan. 15, 2010   (JP) .................................. 2010-007444

(51) Int. Cl.
*H04N 5/232*   (2006.01)
*G03B 13/00*   (2006.01)

(52) U.S. Cl.
USPC .......................................... 348/350; 348/354

(58) Field of Classification Search
None
See application file for complete search history.

(56) References Cited

U.S. PATENT DOCUMENTS

| | | | |
|---|---|---|---|
| 2008/0084483 A1* | 4/2008 | Kusaka | 348/222.1 |
| 2008/0317454 A1 | 12/2008 | Onuki | |
| 2009/0096903 A1* | 4/2009 | Kusaka | 348/302 |
| 2011/0013898 A1* | 1/2011 | Kanai | 396/114 |

FOREIGN PATENT DOCUMENTS

| | | |
|---|---|---|
| JP | 2005-345962 A | 12/2005 |
| JP | 2009-003122 A | 1/2009 |
| WO | WO 2009035147 A1 * | 3/2009 ............... G02B 7/34 |

* cited by examiner

*Primary Examiner* — Nelson D. Hernández Hernández
*Assistant Examiner* — Dennis Hogue
(74) *Attorney, Agent, or Firm* — Fitzpatrick, Cella, Harper & Scinto

(57) ABSTRACT

An image capturing apparatus comprises: an image sensor having image forming pixels for receiving light that has passed through an entire pupil area of an imaging lens which forms an object image, and focus detection pixels, which are arranged discretely among the image forming pixels, for receiving light that has passed through part of the pupil area of the imaging lens; a detection unit configured to detect an edge direction of an object based on an image signal acquired by the image sensor; an averaging unit configured to average image signals, while shifting a phase of the image signals, which are acquired respectively from each of the focus detection pixels, based on the edge direction detected by the detection unit; and a calculation unit configured to calculate a defocus amount of the imaging lens using the image signal averaged by the averaging unit.

3 Claims, 10 Drawing Sheets

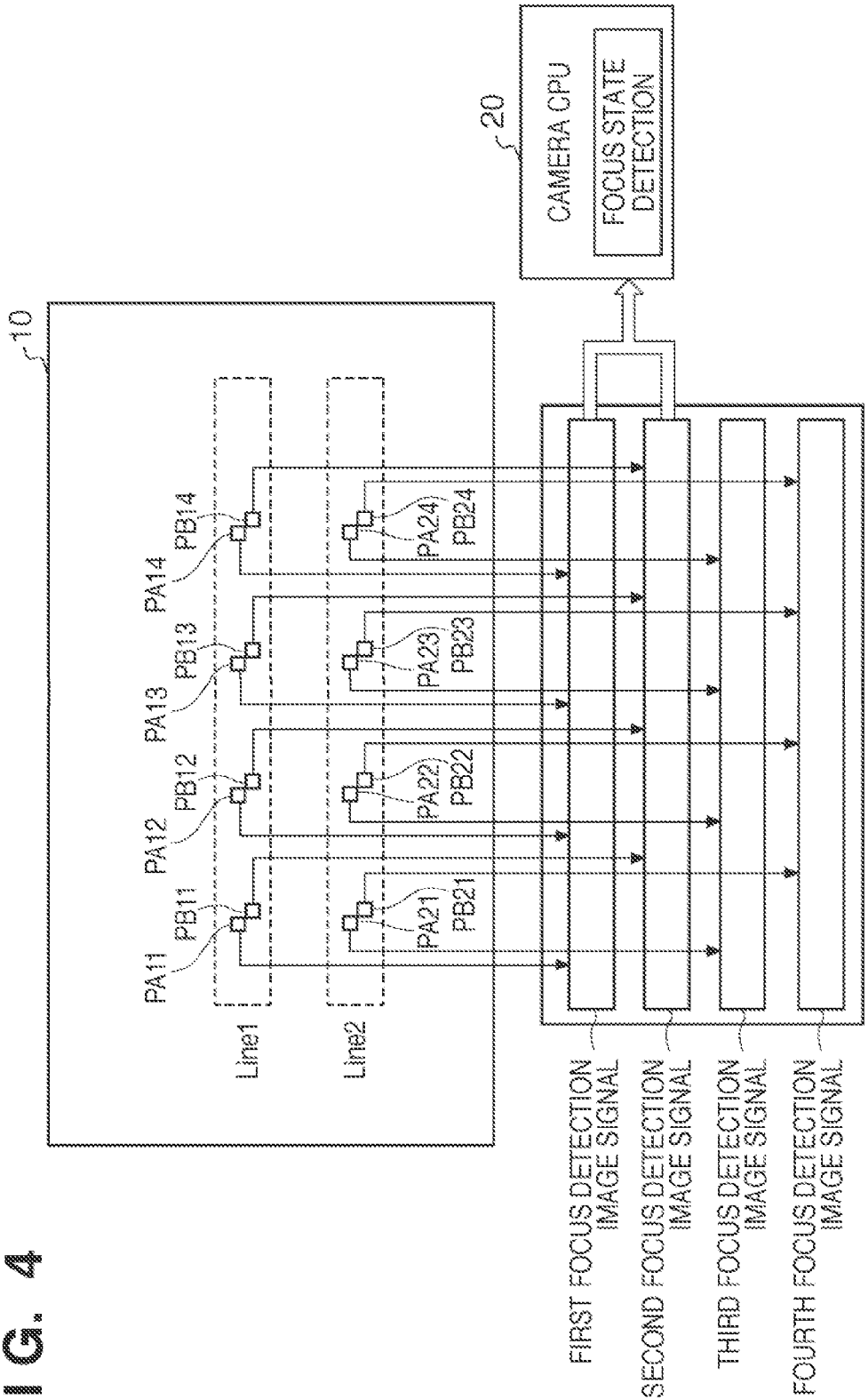

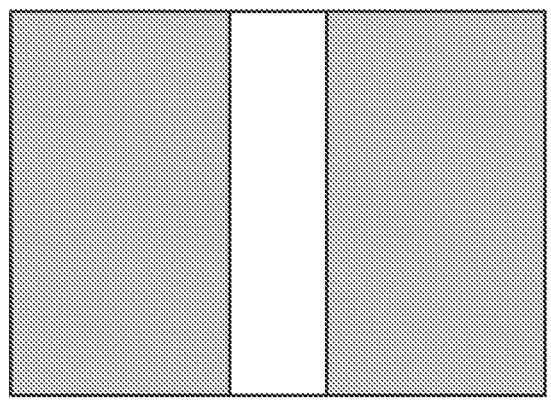
F I G. 6A
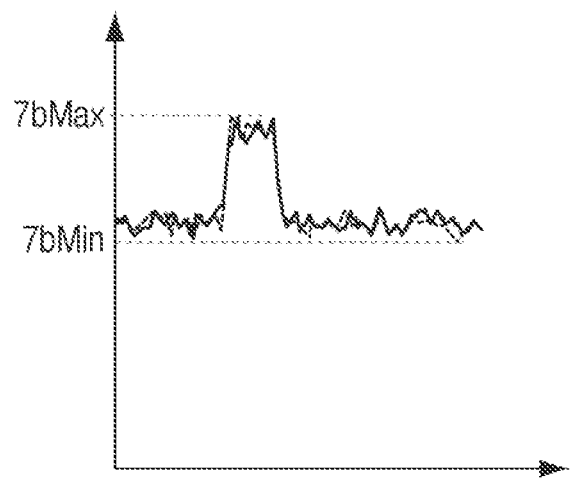
F I G. 6B
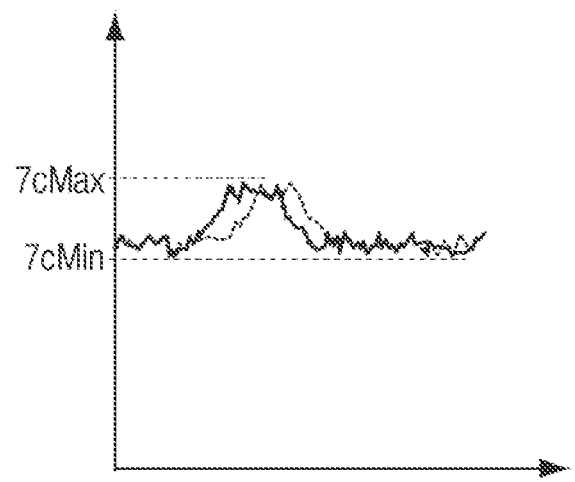
F I G. 6C

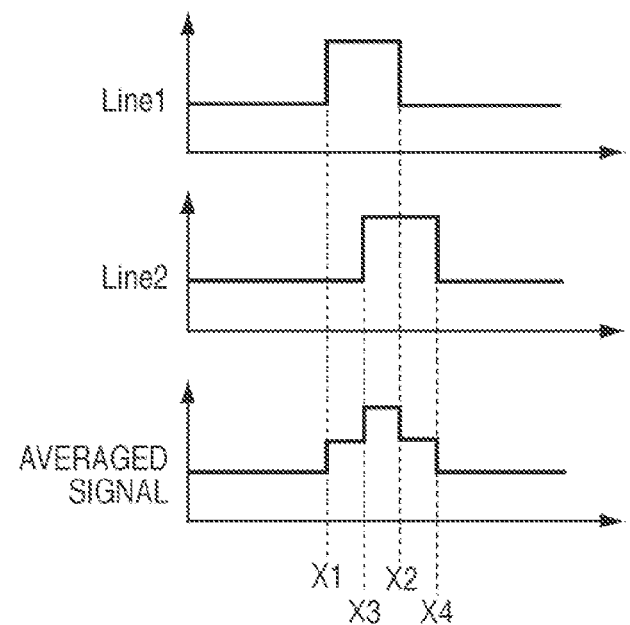
F I G. 9A
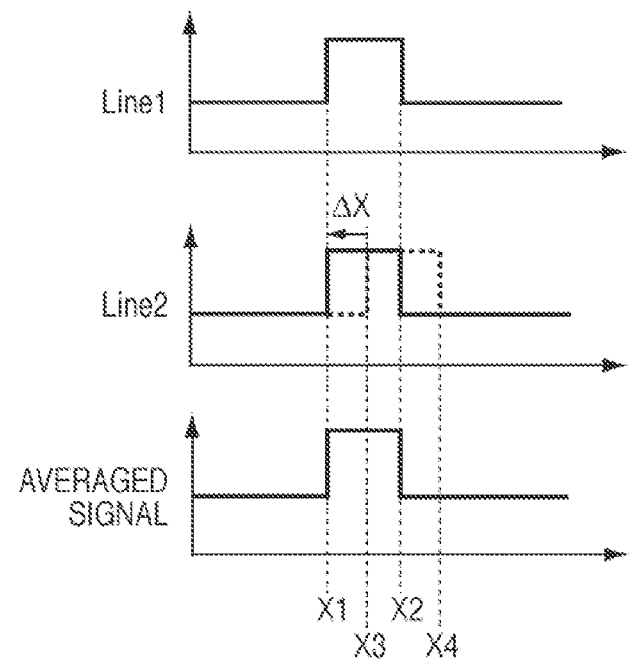
F I G. 9B

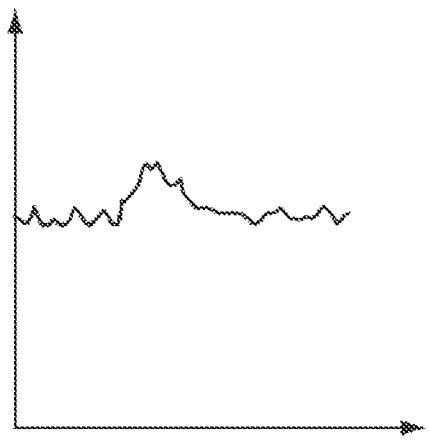
F I G. 10A
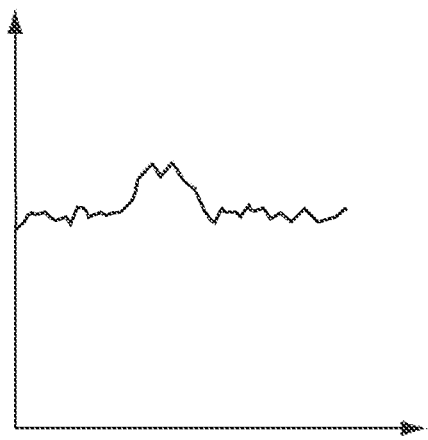
F I G. 10B
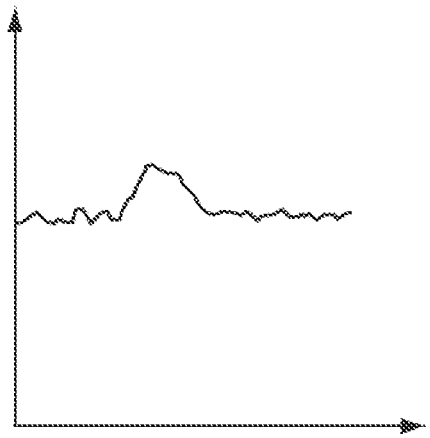
F I G. 10C

IMAGE CAPTURING APPARATUS HAVING FOCUS DETECTION PIXELS PRODUCING A FOCUS SIGNAL WITH REDUCED NOISE

TECHNICAL FIELD

The present invention relates to an image capturing apparatus, and more particularly, to an image capturing apparatus capable of detecting a focus state.

BACKGROUND ART

An image capturing apparatus which performs pupil-division-based focus detection using a two-dimensional sensor having micro-lenses on part of the pixels of a solid-state image sensor is conventionally known as a method for detecting an imaging lens' focus state. In this image capturing apparatus, among a large number of pixels constituting the solid-state image sensor, part of the pixels serve as focus-state detection pixels of the imaging lens. With the use of the focus-state detection pixels, which receive light that has passed through part of the pupil area of the imaging lens, and which receive light that has passed through different pupil areas as a pair, the focus-state detection pixels detect the imaging lens' focus state by a phase difference of image signals which are generated by the plural pairs of pixels. This configuration is disclosed in, for example, Japanese Patent Laid-Open No. 2009-003122.

However, in the technique suggested by Japanese Patent Laid-Open No. 2009-003122, since part of the image forming pixels are used as focus detection pixels, a received light amount is small compared to regular pixels. For this reason, there are problems in that the image capturing apparatus is largely influenced by noise and tends to have poor precision in focus detection.

SUMMARY OF INVENTION

The present invention, which has been made in view of the above-described problems, reduces noise in signals acquired from focus detection pixels and improves focus detection precision in an image sensor whose part of the pixels are used as focus detection pixels.

In order to solve the above-described problems and achieve the objective, an image capturing apparatus according to the present invention comprises an image sensor having image forming pixels for receiving light that has passed through an entire pupil area of an imaging lens which forms an object image, and focus detection pixels, which are arranged discretely among the image forming pixels, for receiving light that has passed through part of the pupil area of the imaging lens; a detection unit configured to detect an edge direction of an object based on an image signal acquired by the image sensor; an averaging unit configured to average image signals, while shifting a phase of the image signals, which are acquired respectively from each of the focus detection pixels, based on the edge direction detected by the detection unit; and a calculation unit configured to calculate a defocus amount of the imaging lens using the image signal averaged by the averaging unit.

Further features of the present invention will become apparent from the following description of exemplary embodiments with reference to the attached drawings.

BRIEF DESCRIPTION OF DRAWINGS

FIG. 4 is an explanatory view of focus detection signal generation;

FIGS. 6A to 6C show an example of a low-contrast object;

FIGS. 9A and 9B show an averaged result in a case where an object's edge direction is diagonal; and FIGS. 10A to 10C are explanatory views of averaging focus detection image signals having noise.

DESCRIPTION OF EMBODIMENTS

Hereinafter, an embodiment of the present invention is described in detail with reference to the accompanying drawings.

Figure 1:
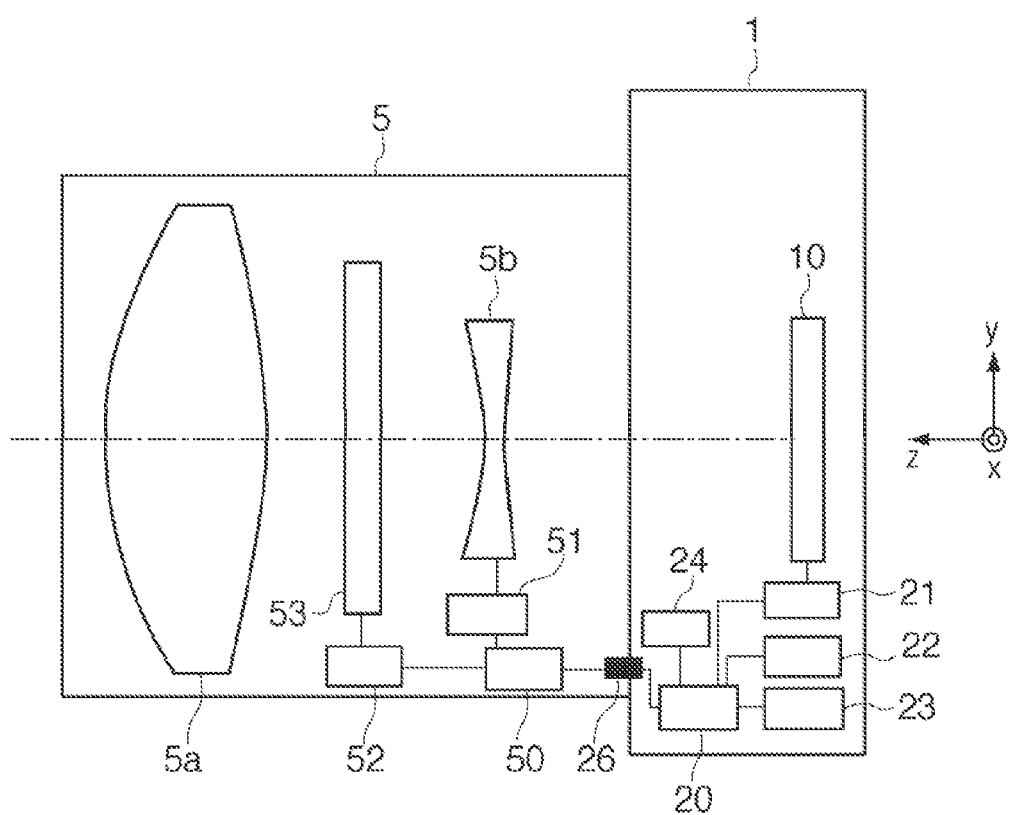
FIG. 1 is a view showing a configuration of a camera, which serves as an image capturing apparatus according to an embodiment of the present invention.

FIG. 1 is a view showing a configuration of a camera, which serves as an image capturing apparatus according to an embodiment of the present invention. In FIG. 1, an image sensor (solid-state image sensor) 10 is arranged on an expected imaging surface of an imaging lens 5, which is mounted to a digital still camera 1. The digital still camera 1 comprises a camera CPU 20 for controlling the overall camera, an image sensor controller 21 which serves as control means for driving the image sensor 10, and an image processor 24 which performs image processing on image signals captured by the image sensor 10. The camera 1 also comprises a memory circuit 22 for recording images captured by the image sensor 10, and an interface circuit 23 for outputting images, which are processed by the image processor 24, out of the camera. Also, the memory circuit 22 can store received-light distribution of the image sensor 10.

The camera CPU 20 also serves as a focus detection calculator for calculating the focus state of the imaging lens 5, a contrast detector for detecting contrast of a captured image, an edge detector for detecting edges of an object, an averaging unit for averaging image signals, and an estimated noise amount storage unit in which an estimated noise amount is set in accordance with image capturing conditions.

The imaging lens 5, which forms an object image, is attachable to or detachable from the camera main unit 1. Although two lenses 5a and 5b are shown in the drawing for the sake of convenience, in reality, the lens 5 is configured with a number of lenses. In the imaging lens 5, focus adjustment data transmitted from the camera CPU 20 of the camera main unit 1 is received by a lens CPU 50 through an electric contact point 26, and the focus state is adjusted by an imaging lens driving mechanism 51 based on the focus adjustment data. A diaphragm 53, which is arranged in the vicinity of the pupil of the imaging lens 5, is throttled to a predetermined aperture value by a diaphragm driving mechanism 52.

Figure 2:
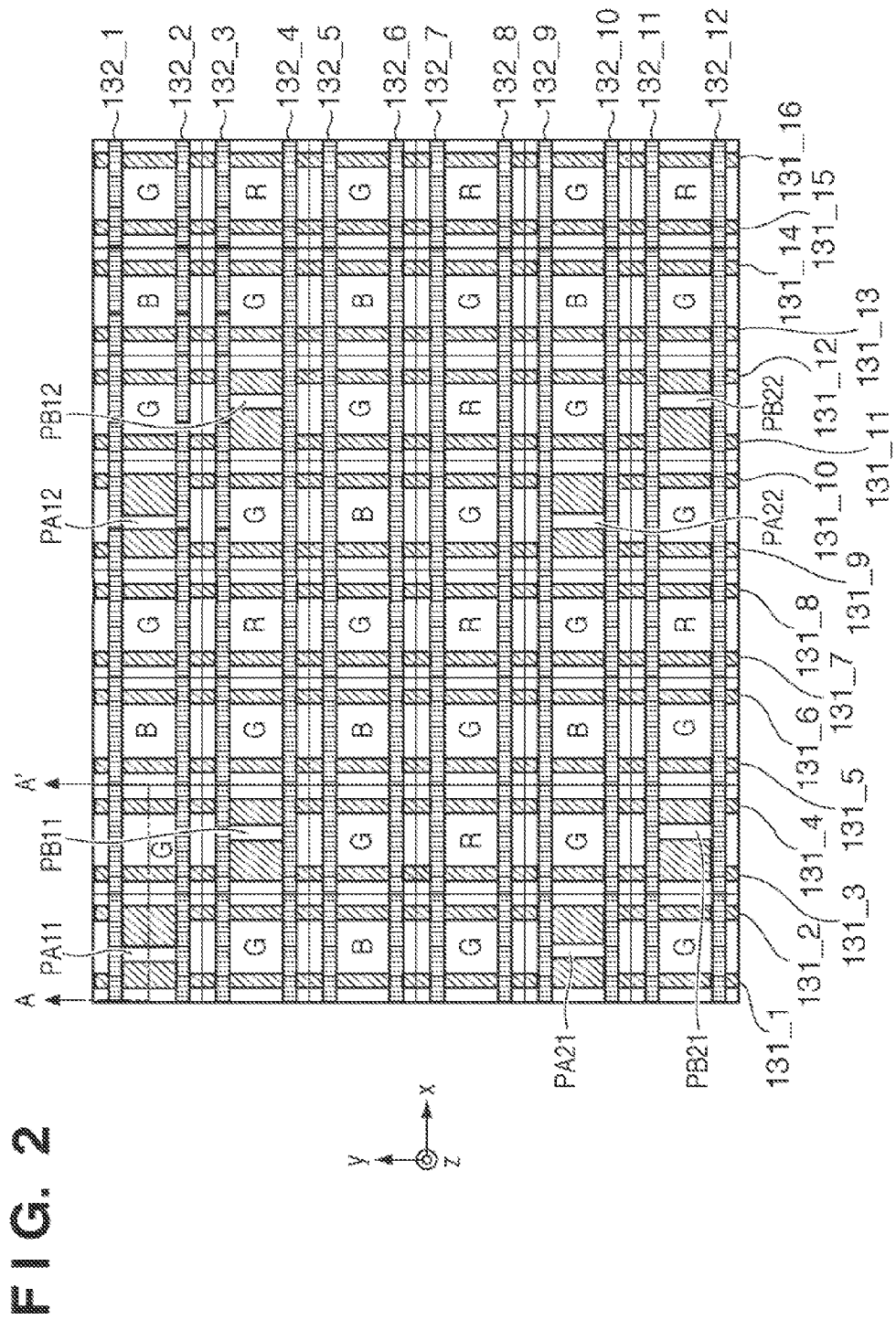
FIG. 2 is a partial plan view of an image sensor, which serves as a CMOS solid-state image sensor in an embodiment of the present invention.

FIG. 2 is a partial plan view of an image sensor, which serves as a CMOS solid-state image sensor in the present embodiment. In FIG. 2, electrodes 131 scan the vertical direction while electrodes 132 scan the horizontal direction. The electrodes 131 and 132 are configured in a layer structure. In this embodiment, the layer of the electrodes 132 is formed on top of the layer of the electrodes 131. The area sectioned by an electrode 131 and an electrode 132 represents one pixel. The letter "R," "G," or "B" in each pixel represents the color filter's hue of the pixel. The pixel "R" transmits light having red components; the pixel "G" transmits light having green components; and the pixel "B" transmits light having blue components. Each of the "R," "G," and "B" pixels (image forming pixels) is configured so as to receive light that has passed through the entire pupil area of the imaging lens 5.

Assuming that the color filter is arranged in a Bayer pattern, one picture element is constructed with four pixels: "R" pixel, "B" pixel, and two "G" pixels. However, in the image sensor constituting the image capturing apparatus of the present embodiment, a focus detection pixel (focus detection pixels), which receives light that has passed through part of the pupil area of the imaging lens 5, is allocated discretely to part of the pixels that are supposed to be "R" or "B." In FIG. 2, pixels PA11, PB11, PA21, and PB21 are provided for detecting the focus state of the imaging lens 5. With these pixels, the aperture in the x direction is limited in the electrodes 131.

Figure 3A:
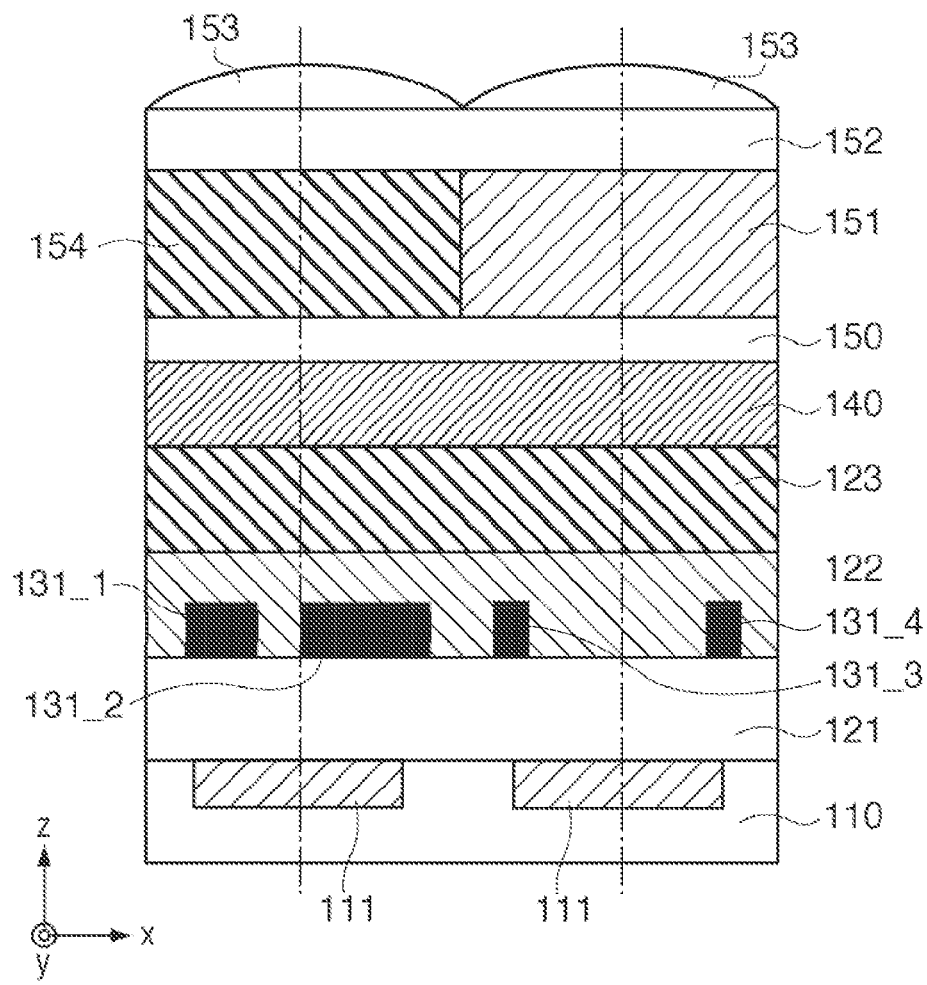
FIG. 3A is a cross-section of the image sensor, which is cut along the A-A' plane indicated on the partial plan view in FIG. 2.

FIG. 3A is a cross-section of the image sensor 10, which is cut along the A-A' plane indicated on the partial plan view in FIG. 2. The pixel on the right side of FIG. 3A indicates a standard pixel (image forming pixel) which can receive light that has passed through the entire pupil area of the imaging lens 5. The pixel on the left side of FIG. 3A indicates a focus detection pixel which can receive light flux from part of the pupil area of the imaging lens 5.

In the image sensor 10, a photoelectric converter 111 is formed inside a silicon substrate 110. A signal electric charge generated by the photoelectric converter 111 is outputted outside through a floating diffusion unit (not shown) and the first and second electrodes 131 and 132 (not shown). Formed between the photoelectric converter 111 and the electrode 131 is an interlayer insulation film 121. Also formed between the electrode 131 and the electrode 132 (not shown) is an interlayer insulation film 122. An interlayer insulation film 123 is formed on the optical incident side of the electrode 132, and further formed are passivation film 140 and planarizing layer 150. On the optical incident side of the planarizing layer 150, a color filter layer 151 is formed for the standard pixel while a transparent filter layer 154 is formed for the focus detection pixel. Further on the optical incident side, a planarizing layer 152 and a micro lens 153 are formed. The power of the micro lens 153 is set in a way that the pupil of the imaging lens and the photoelectric converter 111 are virtually conjugate. Moreover, in pixels located in the center of the image sensor 10, the micro lens 153 is disposed in the center of the pixel, whereas in peripheral pixels, the micro lens 153 is disposed with deviation toward the optical axis of the imaging lens 5.

Light of an object transmitted through the imaging lens 5 is condensed in the vicinity of the image sensor 10. Further, the light that has reached each pixel of the image sensor 10 is refracted by the micro lens 153 and condensed to the photoelectric converter 111. In the standard pixel used in regular image capturing which is shown on the right side of FIG. 3A, the first and second electrodes 131 and 132 are disposed so as not to block the incident light.

On the contrary, in the focus detection pixel for performing focus detection of the imaging lens 5 which is shown on the left side of FIG. 3A, it is so configured that part of the electrode 131 covers the photoelectric converter 111. As a result, the focus detection pixel shown on the left side of FIG. 3A can receive light flux that has passed through part of the pupil of the imaging lens 5. In order to prevent reduced output of the photoelectric converter 111, which is caused by the electrode 131 blocking part of the incident light flux, the color filter layer 154 for focus detection pixel is formed with transparent resin which has high transmissivity and does not absorb light.

Figure 3B:
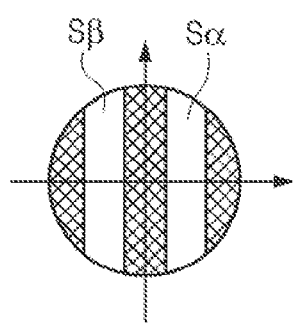
FIG. 3B is a view showing received-light distribution in a pupil area of a pixel for focus detection.

FIG. 3B shows received-light distribution in a pupil area of a pixel for focus detection, which is located in the center of the image sensor 10. The shaded area of the circle in FIG. 3B indicates the imaging lens' exit pupil, and the white areas $S\alpha$ and $S\beta$ indicate the light receivable areas PA11 and PB11 respectively. As described above, the focus detection pixels disposed on part of the image sensor 10 according to the present embodiment are configured in a way that, by differing the relative position between the micro lens 153 and the aperture center of the electrode 131, the distribution of the received light that has passed through the imaging lens 5 becomes different.

FIG. 4 is an explanatory view of focus detection image signal generation. Line 1 which is part of the image sensor 10 indicates a distance measurement area of an object which is targeted to distance measurement, and Line 2 indicates a distance measurement area adjacent to Line 1. First focus detection image signals are generated by first pixels (PA11 to PA14 in FIG. 4) which receive light from part of the pupil area of the imaging lens. Similarly, second focus detection image signals are generated by second pixels (PB11 to PB14) which receive light from a pupil area different from the first pixels. A pair of first and second focus detection image signals is focus detection image signals of Line 1. Similarly, third focus detection image signals are generated by first pixels (PA21 to PA24) which receive light from part of the pupil area of the imaging lens, and fourth focus detection image signals are generated by second pixels (PB21 to PB24) which receive light from a pupil area different from the first pixels. For ease of explanation, the focus detection image signals are formed by four pixels. However, in reality, the focus detection image signals are formed by the number of pixels sufficient for correlation calculation (for example, 100 pixels).

The camera CPU 20, which serves as focus detection calculator, carries out a known correlation calculation based on the first and second focus detection image signals generated in the above-described method, thereby detecting a focus state of the imaging lens 5. Furthermore, based on the focus detection result, the camera CPU 20 sends focus adjustment data to the imaging lens driving mechanism 51, thereby adjusting the focus of the imaging lens 5.

Figure 5A:
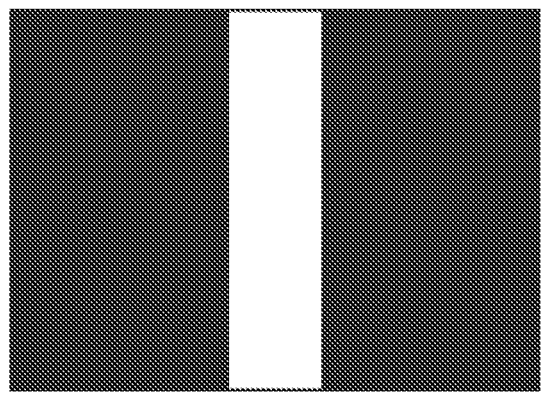
FIGS. 5A to 5C show an example of a high-contrast object.
Figure 5B:
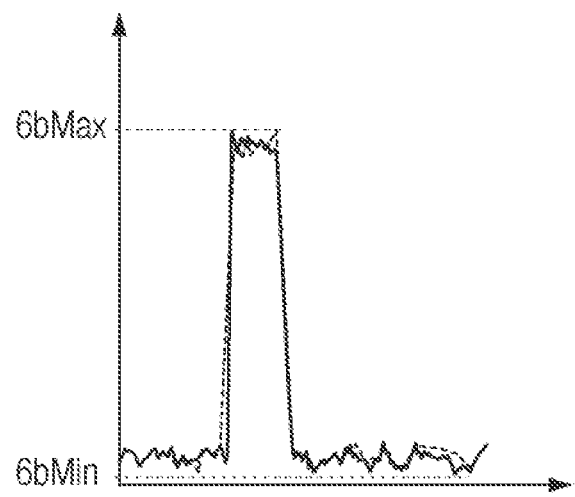
Figure 5C:
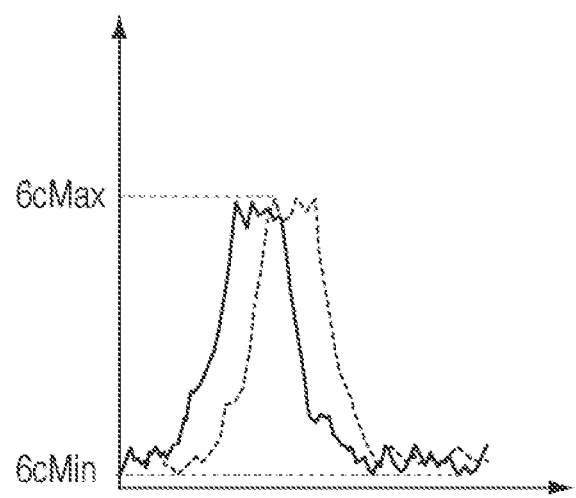

An object and focus detection image signals are described with reference to FIGS. 5A to 5C and FIGS. 6A to 6C. FIGS. 5A to 5C show an example of a high-contrast object. Taking the high-contrast chart shown in FIG. 5A as an example of an object, focus detection image signals shown in FIG. 5B are obtained near the focused position. In FIG. 5B, the solid line indicates the first focus detection image signal, and the dotted line indicates the second focus detection image signal. 6bMax indicates the maximum value of the focus detection image signal, while 6bMin indicates the minimum value of the focus detection image signal.

Meanwhile, in a defocused state, focus detection image signals shown in FIG. 5C are obtained. In FIG. 5C, the solid line indicates the first focus detection image signal, and the dotted line indicates the second focus detection image signal. 6cMax indicates the maximum value of the focus detection image signal, while 6cMin indicates the minimum value of the focus detection image signal. Since the image is blurred in a defocused state, in the first and second focus detection image signals, the maximum value 6cMax is smaller than the maximum value 6bMax obtained near the focused position.

Further, the first and second focus detection image signals have phase shifting. A focused state is detected based on the amount of phase shifting. The amount of phase shifting is obtained, with the use of a known correlation calculation or the like, based on a shifting amount having a highest degree of correlation in a case where the image is shifted in the right-left direction. When the image has noise as shown in FIGS. 5B and 5C, an error is generated in calculation of the degree of correlation. However, in the case of a high-contrast object shown in FIGS. 5B and 5C, contrast of the overall image signals (6bMax−6bMin or 6cMax−6cMin) is sufficiently large compared to the noise. For this reason, influence of the noise upon calculation of the degree of correlation is small; and therefore, a practically sufficient amount of phase shifting can be detected.

FIGS. 6A to 6C show an example of a low-contrast object. Taking the low-contrast chart shown in FIG. 6A as an example of an object, focus detection image signals shown in FIG. 6B are obtained near the focused position. In FIG. 6B, the solid line indicates the first focus detection image signal, and the dotted line indicates the second focus detection image signal. 7bMax indicates the maximum value of the focus detection image signal, while 7bMin indicates the minimum value of the focus detection image signal. When the object shown in FIGS. 6A to 6C is compared to the object shown in FIGS. 5A to 5C, the contrast of the overall image is expressed by (6bMax−6bMin)>(7bMax−7bMin). Note, near the focused position, since the contrast (7bMax−7bMin) of the overall image signal of the low-contrast object shown in FIGS. 6A to 6C is relatively large compared to noise, influence of the noise upon calculation of the degree of correlation is small; and therefore, a practically sufficient amount of phase shifting can be detected. Meanwhile, in a defocused state, focus detection image signals shown in FIG. 6C are obtained. 7cMax indicates the maximum value of the focus detection image signal, while 7cMin indicates the minimum value of the focus detection image signal. As similar to the case of the high-contrast object described in FIGS. 5A to 5C, since the image is blurred in a defocused state, in the first and second focus detection image signals, the maximum value 7cMax is smaller than the maximum value 7bMax obtained near the focused position. Therefore, contrast of the overall image signals (7cMax−7cMin) further declines from the contrast (7bMax−7bMin) obtained near the focused position. As a result, noise influence becomes large, causing an error in calculation of the phase shifting.

Noise superimposed on pixel signals of a CMOS image sensor can largely be categorized into two types. One is random noise that is generated at random in terms of time and space (in other words, in a two-dimensional output screen). The other is fixed-pattern noise that is generated in a fixed pattern, such as vertical stripes, horizontal stripes, screen surface irregularity or the like on the same position of an output screen. Random noise appears as uneven noise as if the entire screen is seen through frosted glass. Random noise is generated mainly by optical shot noise, thermal noise or the like, inside a diode of a pixel, at an amplified pixel, or at other amplified spots, and easily changes depending on an environmental temperature. Meanwhile, fixed-pattern noise is often caused by a difference in threshold voltages of pixels' MOS transistors, or an unbalanced electric character in other circuits (for instance, a capacitor of a CDS circuit provided for each vertical signal line) or wiring.

Since fixed-pattern noise has a fixed pattern, noise can be reduced by storing a correction amount in advance, in the aforementioned two types of noise. On the contrary, since random noise occurs at random, a correction amount cannot be stored in advance. To reduce random noise, it is effective to average signals and reduce influence of the noise. Therefore, in this embodiment, correction is performed based on a noise pattern stored in advance for reducing a fixed-pattern noise, while focus detection image signals are averaged for reducing random noise. Note that, since the present embodiment is mainly purposed to reduce random noise, the present embodiment describes processing of image signals of which all fixed-pattern noise has been removed.

Figure 7:
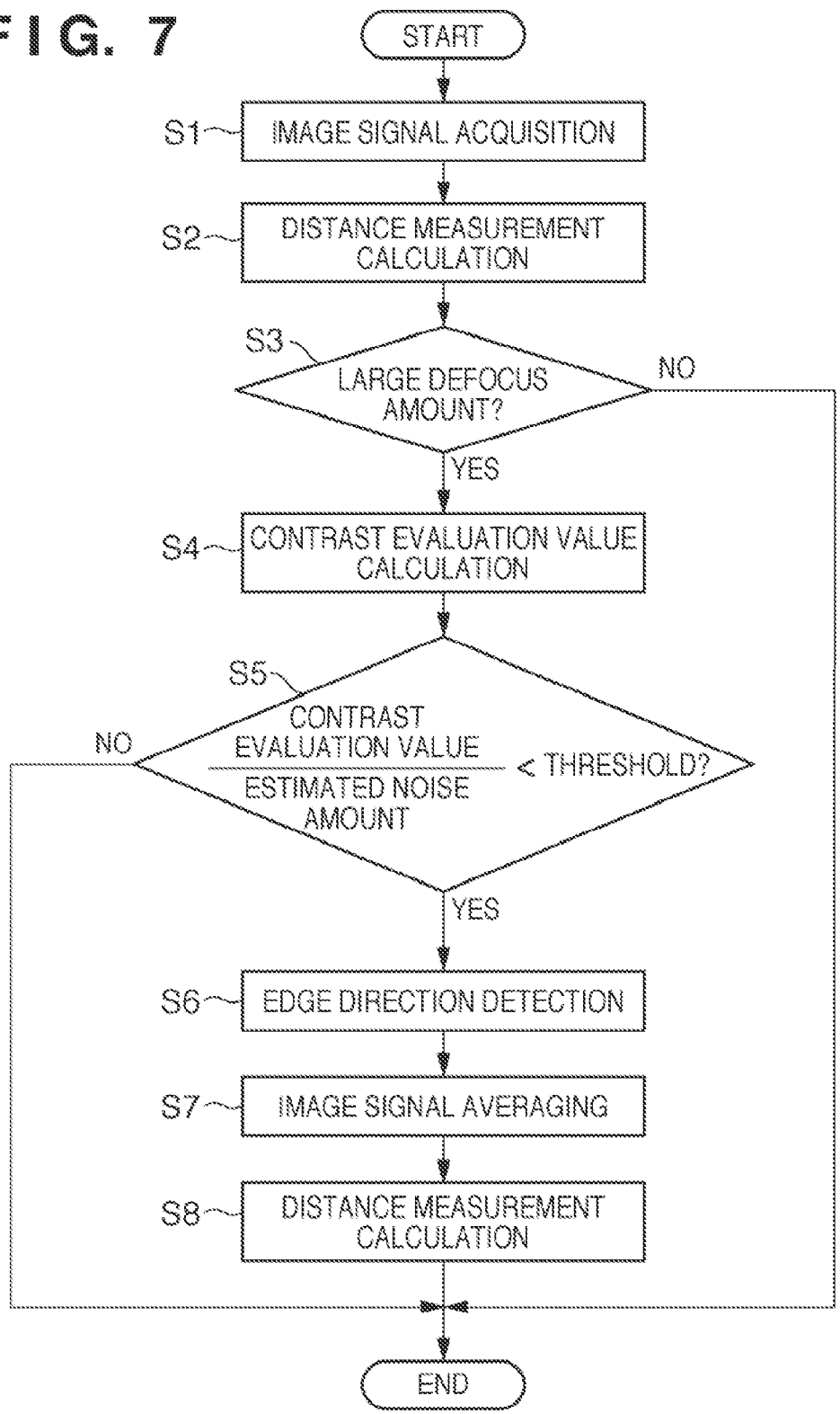
FIG. 7 is a focus detection flowchart according to an embodiment of the present invention.

FIG. 7 is a flowchart describing defocus amount calculation according to the present embodiment. When a release switch of the camera main unit 1 is depressed and exposure operation of the image sensor 10 is started, light flux that transmits through the imaging lens 5 is incident upon the photoelectric converter 111 of each pixel of the image sensor 10. In accordance with the amount of light flux, it is converted to electric signals by the photoelectric converter 111, and the focus detection flow is started.

In step S1, focus detection image signals are acquired. As has been described with reference to FIG. 4, first and second focus detection image signals are acquired. When focus detection image signals are acquired, the control proceeds to step S2. In step S2, correlation calculation is performed based on the focus detection image signals acquired in step S1, thereby calculating a defocus amount.

In step S3, the defocus amount calculated in step S2 is compared with a predetermined threshold. If an absolute value of the defocus amount is equal to or smaller than the threshold, the averaging of focus detection image signals, which will be carried out in the following steps, is unnecessary. Therefore, this flow is terminated, and the defocus amount calculated in step S2 is outputted. If the absolute value of the defocus amount is larger than the threshold, the control proceeds to step S4. In step S4, the camera CPU 20 calculates a contrast evaluation value of the object's image signals. When the contrast evaluation value calculation is completed, the control proceeds to step S5.

In step S5, the ratio between the contrast evaluation value calculated in step S4 and an estimated noise amount read by the camera CPU 20 is compared to a threshold which is set in advance. The estimated noise amount read herein is set based on a combination of exposure time and ISO sensitivity, taking into consideration that noise becomes large when long exposure time is set or when high ISO sensitivity (imaging sensitivity) is set. If a value obtained by dividing the contrast evaluation value by the estimated noise amount is equal to or larger than the threshold, the averaging of focus detection image signals which will be carried out in the following steps is unnecessary. Therefore, this flow is terminated, and the defocus amount calculated in step S2 is outputted. If the value obtained by dividing the contrast evaluation value by the estimated noise amount is less than the threshold, the control proceeds to step S6.

In step S6, the camera CPU 20 detects the object's edge direction based on the image signals. The edge direction detection is performed for deciding the image signal adding direction in the next step S7.

Figure 8A:
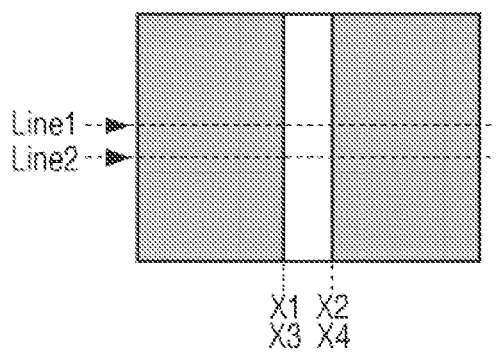
FIGS. 8A to 8D are schematic diagrams showing a relation between an object and image signals.
Figure 8B:
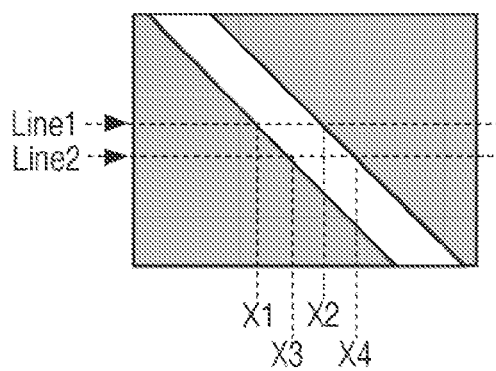
Figure 8C:
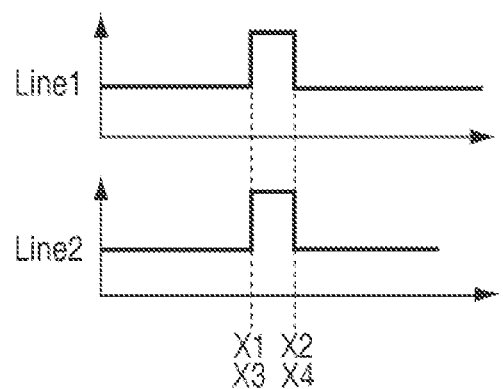
Figure 8D:
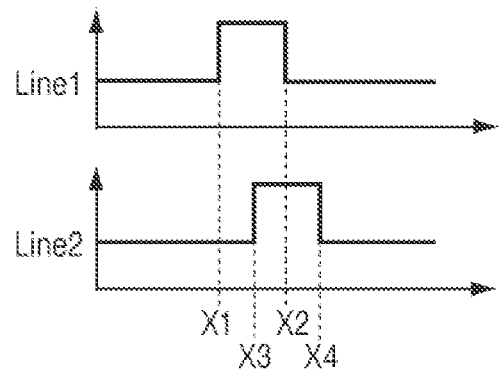

The edge direction detection method is described with reference to FIGS. 8A to 8D. FIGS. 8A to 8D are schematic diagrams showing a relation between an object and focus detection image signals. FIGS. 8A and 8B show an object, and FIGS. 8C and 8D show focus detection image signals corresponding to respective objects in FIGS. 8A and 8B. For ease of explanation, a simple bar chart is used as the object, and only one of the image signals (the first and third focus detection image signals in FIG. 4) used for correlation calculation is described as the focus detection image signals. FIG.

8A shows a bar chart having an edge in the vertical direction, while FIG. 8B shows a bar chart having an edge in the diagonally right-down direction. Line 1 and Line 2 shown in FIGS. 8A and 8B represent the array of focus detection pixels shown in FIG. 4. X1 and X2 represent coordinates (i.e. edge coordinates) where the luminance in line 1 changes, and X3 and X4 represent coordinates (i.e., edge coordinates) where the luminance in Line 2 changes.

FIG. 8C shows focus detection image signals which are acquired when the vertical bar chart in FIG. 8A is captured. The upper signal is a focus detection image signal acquired from Line 1, and the lower signal is a focus detection image signal acquired from Line 2. FIG. 8D shows focus detection image signals which are acquired when the diagonally right-down bar chart in FIG. 8B is captured. The upper signal is a focus detection image signal acquired from Line 1, and the lower signal is a focus detection image signal acquired from Line 2. In a case where the object has a vertical edge direction as shown in FIG. 8C, the focus detection image signals of line 1 and line 2 have the same phase (in other words, coordinate X1=coordinate X3 and coordinate X2=coordinate X4). Meanwhile, in a case where the object has a diagonal edge direction as shown in FIG. 8D, the focus detection image signals of line 1 and Line 2 have shifted phases. When calculation of the shifted phase amount (a difference between the coordinates X3 and X1) is completed (in other words, when edge detection is completed), the control proceeds to step S7.

In step S7, the phases of the focus detection image signals, which are subjected to averaging, are adjusted based on the edge detection result, and image signal averaging is performed. As described in FIGS. 8A to 8D, if the object's edge direction is vertical, focus detection image signals of Line 1 and Line 2 have the same phase. Therefore, by averaging the signals without shifting the phase, focus detection image signals with reduced noise can be acquired. Meanwhile, if the object's edge direction is diagonal, focus detection image signals of Line 1 and Line 2 have shifted phases as described in FIGS. 8A to 8D. FIGS. 9A and 9B show an averaged result of the signals in a case where the object's edge direction is diagonal.

FIG. 9A shows a case where the image signals are averaged without shifting the phases. Shown are, from the top, a focus detection image signal of Line 1, a focus detection image signal of Line 2, and an averaged focus detection image signal of the signals acquired from Line 1 and Line 2 without shifting the phases. As shown in FIG. 9A, in a case where the edge direction is diagonal, on the coordinates of shifted phases, the focus detection image signals of line 1 and Line 2 have different luminance, and therefore, the image becomes blurry. FIG. 9B shows a case where the image signals are averaged with shifted phases. Shown are, from the top, a focus detection image signal of Line 1, a focus detection image signal of Line 2, and an averaged focus detection image signal of the signals acquired from Line 1 and Line 2 with shifted phases. The dotted line in FIG. 9B indicative of the focus detection image signal of Line 2 represents an image signal before the phase is shifted, while the solid line represents an image signal after the phase is shifted. The phase shifting amount Δx is calculated based on the edge direction detection result which is calculated in step S6. By virtue of shifting the phases and averaging the signals, it is possible to acquire noise-free focus detection image signals without blurry edges.

FIGS. 10A to 10C are explanatory views of averaging the focus detection image signals having noise. For ease of explanation, only one of the image signals used for correlation calculation is shown as the focus detection image signals. FIG. 10A shows a focus detection image signal of Line 1; FIG. 10B, a focus detection image signal of Line 2; and FIG. 10C, an averaged focus detection image signal of the image signals of FIGS. 10A and 10B. As can be seen from FIGS. 10A to 10C, the focus detection image signal, on which averaging has been performed, apparently has reduced noise compared to the focus detection image signal on which averaging has not been performed.

After image signal averaging is completed, the control proceeds to step S8. In step S8, known correlation calculation is performed based on the focus detection image signal, which has been averaged in step S7, for defocus amount calculation. Because the focus detection image signals on which averaging has been performed have clear edges, highly reliable correlation calculation is possible. When the defocus amount calculation is completed, this flow ends.

According to the above-described configuration, it is possible to provide an image capturing apparatus which realizes noise reduction and improved focus detection precision.

Note that, for another method of noise reduction, correlation calculation may be performed with respect to each of the focus detection image signals of Line 1 and Line 2 for defocus amount calculation, and each of the calculated defocus amounts may be averaged for removing noise. However, when correlation calculation is performed with respect to each of the focus detection image signals of Line 1 and Line 2, if the noise amount is large compared to the object's contrast, often times distance measurement cannot be performed. On the contrary, averaging the focus detection image signals before correlation calculation achieves an effect of preventing such event of distance measurement incapability. Therefore, by reducing noise of the focus detection image signals before correlation calculation, it is possible to push up the detection limit.

In the present embodiment, whether or not to perform image signal averaging is determined based on the ratio between the contrast of an object and an estimated noise amount. However, the embodiment may be so configured to perform image signal averaging at all times. Furthermore, although whether or not to perform image signal averaging is determined in accordance with a defocus amount, the image signal averaging may be performed regardless of the defocus amount.

Still further, an edge direction may be detected by a method other than the detection method described in the present embodiment (for instance, using a summation of a square of an image signal luminance level changing amount as an evaluation value, an edge direction may be detected based on changes in the evaluation values obtained from different angles of the read image signals).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-007444, filed Jan. 15, 2010, which is hereby incorporated by reference herein in its entirety.

The invention claimed is:
1. An image capturing apparatus comprising:
an image sensor having image forming pixels for receiving light that has passed through an entire pupil area of an imaging lens which forms an object image, and focus detection pixels, which are arranged discretely among the image forming pixels, for receiving light that has passed through part of the pupil area of the imaging lens;

a detection unit configured to detect an edge direction of an object based on an image signal acquired by said image sensor;

an averaging unit configured to average image signals, while shifting a phase of the image signals, which are acquired respectively from each of the focus detection pixels, based on the edge direction detected by said detection unit; and a calculation unit configured to calculate a defocus amount of the imaging lens using the image signal averaged by said averaging unit.

2. The image capturing apparatus according to claim 1, further comprising:

a contrast detection unit configured to detect a contrast of an object image based on an image signal acquired by said image sensor; and an estimation unit configured to estimate a noise amount generated in the focus detection pixels based at least on exposure time and imaging sensitivity of said image capturing apparatus, wherein based on a ratio between a contrast value detected by said contrast detection unit and a noise amount estimated by said estimation unit, said averaging unit determines whether or not to average image signals which are acquired respectively from each of the focus detection pixels.

3. The image capturing apparatus according to claim 1, wherein based on the defocus amount calculated by said calculation unit, said averaging unit determines whether or not to average image signals which are acquired respectively from each of the focus detection pixels.

* * * * *